United States Patent [19]

Setoyama et al.

[11] Patent Number: 4,986,890
[45] Date of Patent: Jan. 22, 1991

[54] THIN FILM DEPOSITION SYSTEM

[75] Inventors: Eiji Setoyama; Mitsuhiro Kamei, both of Hitachi, Japan

[73] Assignee: Hitachi, Ltd., Tokyo, Japan

[21] Appl. No.: 513,763

[22] Filed: Apr. 24, 1990

[30] Foreign Application Priority Data

Apr. 28, 1989 [JP] Japan .................................. 1-110690

[51] Int. Cl.$^5$ ............................................. C23C 14/34
[52] U.S. Cl. ........................ 204/298.06; 204/298.09; 204/298.11; 204/298.15; 204/298.23
[58] Field of Search ...................... 204/192.12, 298.06, 204/298.09, 298.11, 298.15, 298.23, 298.25, 298.26

[56] References Cited

U.S. PATENT DOCUMENTS

| 4,132,624 | 1/1979 | King et al. ...................... 204/298.29 |
| 4,439,261 | 3/1984 | Pavone et al. ............. 204/298.15 X |
| 4,466,877 | 8/1984 | McKelvey ...................... 204/298.23 |
| 4,581,118 | 4/1986 | Class et al. ................. 204/298.15 X |
| 4,756,815 | 7/1988 | Turner et al. .................. 204/298.25 |

Primary Examiner—Nam X. Nguyen
Attorney, Agent, or Firm—Antonelli, Terry, Stout & Kraus

[57] ABSTRACT

A thin film deposition system for depositing a thin film on a substrate by sputtering is characterized in that a substrate holder for holding thereon the substrate is transferred by a transfer mechanism from or to a film deposition position to or from another position such as another chamber different from the film deposition chamber, an electrode for applying bias voltage of radio frequency to the substrate or substrate holder is axially movable relatively to the substrate holder so that the electrode can be contacted with or discontact from the substrate holder, and a grounded shield is provided so as to cover the electrode and the substrate holder with a gap thereby shielding radio frequency from the electrode and the substrate holder to prevent formation of glow discharge between a wall of the vacuum chamber and the electrode or the substrate holder.

17 Claims, 2 Drawing Sheets

THIN FILM DEPOSITION SYSTEM

BACKGROUND OF THE INVENTION

The present invention relates to a thin film deposition system and, more particularly, to a thin film deposition system having an electrode construction suited to apply radio frequency bias voltage to a substrate in an inline or load lock type system for mass-production.

Thin film deposition systems by sputtering are used widely in various fields as important means for deposition of thin films or layers of various kinds of material. In particular, nowadays, miniaturization and enhancement in performance are progressing, and mass-production by the sputtering system is required. In order to satisfy the requirement, various techniques has been developed. Particularly, bias sputtering technique and an inline film deposition technique each have become important among those techniques.

The bias sputtering employing radio frequency, which is different in mechanism from etching, effects sputtering and film deposition at the same time, so that it is difficult to incorporate the bias sputtering into an inline system. Therefore, most of conventional thin film deposition system bias sputtering are such a type that a substrate on which a thin film is to be deposited is fixed, as disclosed in Japanese Patent Laid-Open No. 62-253765 (1987). As a special case, Japanese Patent Laid-Open No. 62-80266 (1987) discloses a thin film deposition system provided with a carrousel type rotational substrate holder to which bias is applied. However, an inline type thin film deposition system of a substrate transfer type, which can be used as an inline system, has not been put into practice as yet.

In case of effecting bias-sputtering by radio frequency in an inline sputtering system, radio frequency bias voltage control, radio frequency plasma control, etc. are important subjects. The condition that radio frequency is applied to a movement type substrate holder influences greatly the film deposition.

Namely, an electrode for applying radio frequency to the substrate holder holding a substrate is connected to or disconnected from the substrate holder at each time the substrate is transferred. The contact condition between the substrate holder and the electrode changes greatly a reactance component of impedance of a electrode circuit. Therefore, even if negative bias voltage is monitored at a radio frequency power source side, it is difficult to suitably control the electric power to be supplied to the substrate holder, therefore, change in film deposited on the substrate is inevitable. Even if the bias power is constant, change in the bias voltage, even change of 20 to 30%, often takes place in order to make the bias voltage constant.

On the other hand, a weak glow-discharge is generated between the substrate or substrate holder and the vacuum chamber wall when radio frequency power is applied on the substrate. Although this is because of no provision of a suitable shield for shielding radio frequency, it is very difficult to provide the shield so as to cover completely the substrate holder which is constructed to be movable. Therefore, power loss is inevitable. Further, when the reactance component of the RF (radio frequency) shield to the electrode is not made exactly the same at each time of transfer of the substrate, stable film deposition can not be achieved.

Further, if the substrate or the substrate holder is provided with the RF shield, it is troublesome to provide a heater for heating the substrate. In case the RF shield is provided, it is necessary to be keep a very narrow gap of about 2 to 4 mm between the shield and the substrate holder in order to suppress the formation of discharge between the shield and the substrate or the substrate holder. Therefore, it is difficult to provide the heater in such a narrow gap.

SUMMARY OF THE INVENTION

An object of the present invention is to provide a thin film deposition system which is able to be used as an inline system and has a bias-sputtering mechanism wherein a substrate electrode for applying bias voltage of radio frequency on a substrate is able to be stably connected to or disconnected from a transfer type substrate holder, and the electrode and the substrate holder are covered with a shield for shielding radio frequency to prevent glow-discharge between the electrode, the substrate holder and portions surrounding them, whereby the bias-sputtering mechanism is stable in characteristic and high in performance.

An aspect of the present invention resides in a thin film deposition system for depositing a thin film on a substrate by sputtering characterized in that a substrate holder for holding thereon the substrate is transferred by a transfer mechanism from or to a film deposition position to or from another position such as another chamber different from the film deposition chamber, an electrode for applying bias voltage of radio frequency to the substrate or substrate holder is axially movable relatively to the substrate holder so that the electrode can be contacted with or discontact from the substrate holder, and a grounded shield is provided so as to cover the electrode and the substrate holder with a gap thereby shielding radio frequency from the electrode and the substrate holder to prevent formation of glow-discharge between a wall of the vacuum chamber and the electrode or the substrate holder.

An example of the shield comprises a coaxial tube coaxially surrounding the electrode with a gap and fixed to the electrode by an insulating material, and an earth shield covering the substrate holder with a distance therebetween at an opposite side to the side on which the substrate is mounted. The coaxial tube is constructed such that an end of the tube is tightly contactable with the substrate holder at a central portion.

Further, an example of each of the electrode and the coaxial tube has a tapered end which is fitted in a conically shaped portion formed in the central portion of the substrate holder or the earth shield, whereby the coaxial tube and the electrode can be tightly contacted with the earth shield and the substrate holder, respectively.

Between the coaxial tube and the vacuum chamber a sealing is provided to keep a hermetic condition.

If desired, a heater is provided for heating the substrate. Preferably, the heater is embedded in the substrate holder so that it can be provided without changing a suitable gap between the earth shield and the substrate holder.

As mentioned above, the thin film deposition system can be used in an inline system which is suitable for mass-production and in which another or other vacuum chambers are provided adjacent to the vacuum chamber in which sputtering is effected.

DETAILED DESCRIPTION OF THE INVENTION

An embodiment of a thin film deposition system of the present invention will be described hereunder in detail, referring to FIG. 1.

Figure 1:
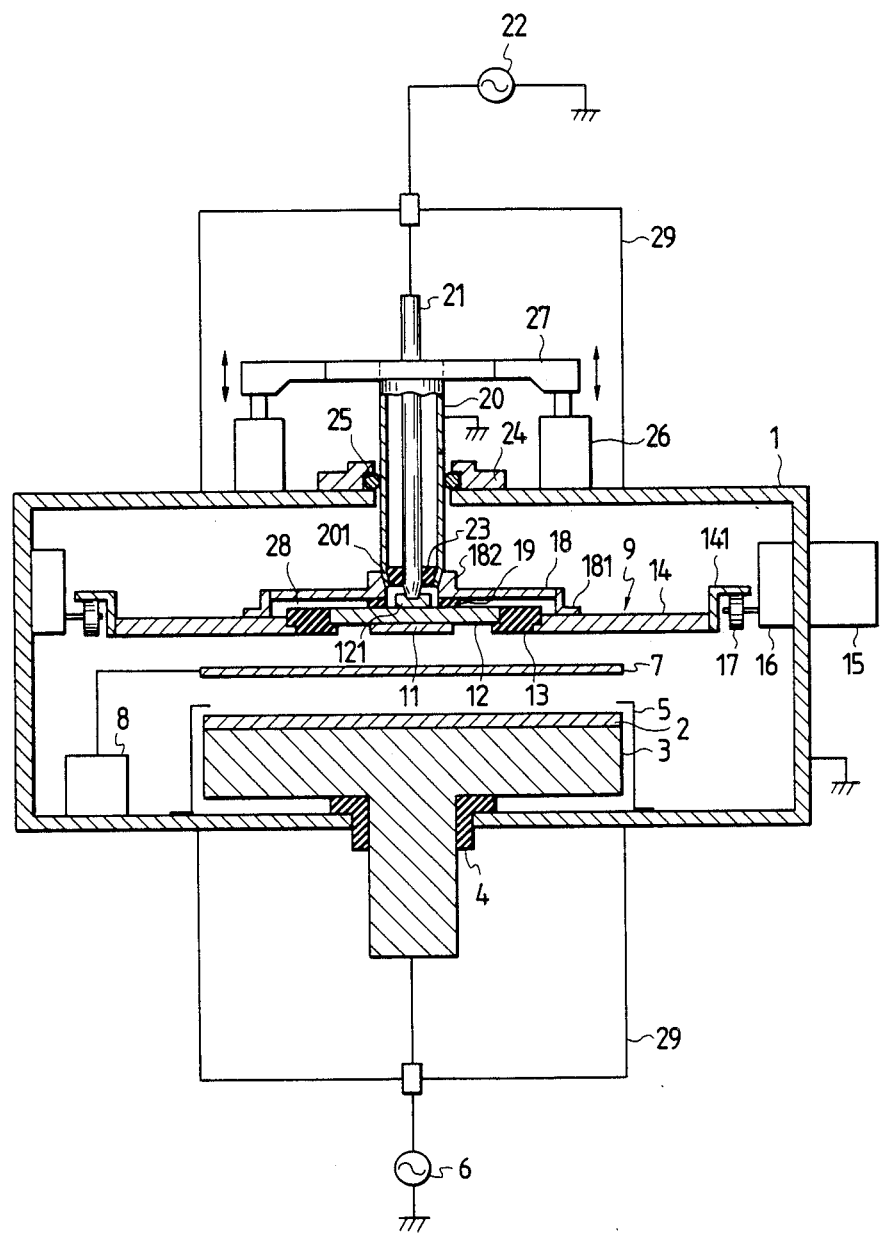
FIG. 1 is a sectional view of a thin film deposition system of an embodiment of the present invention.
Figure 2:
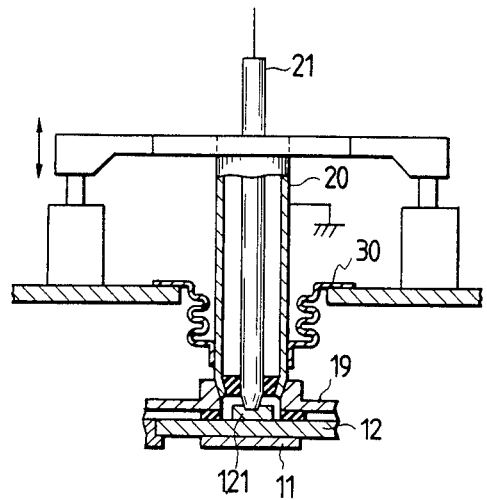
FIG. 2 is a sectional view of another embodiment of a sealing employed in the thin film deposition system according to the present invention.

In FIG. 1, the thin film deposition system or sputtering system for thin film deposition comprises a vacuum chamber 1 containing therein an inert gas such as Ar gas, a cathode electrode 3 disposed in the vacuum chamber 1 and mounting thereon a target 2 from which sputters are formed during sputtering, a substrate holder 9 for holding a substrate 11 on which a thin film or layer is to be deposited so as to be opposite to the target 2 with a distance therebetween, a transfer mechanism for transferring the substrate holder 9 to or from a film deposition position from or to another position such as another chamber, an axial movement type electrode mechanism including a substrate electrode 21 for applying radio frequency bias voltage to the substrate 11 through the substrate holder 9, a moving mechanism for moving the electrode perpendicularly to the substrate 11 such as upward and downward, and a coaxial tube 20 coaxially surrounding the substrate electrode 21 to shield radio frequency, and an earth shield 18 for shielding radio frequency from the substrate holder 9.

The vacuum chamber 1 as shown in FIG. 1 is a part of an inline system or load lock type system. In the vacuum chamber 1, the cathode electrode 3 on which the target 2 is mounted is fixed to a bottom of the vacuum chamber 1 through an insulating material 4 such as an insulating stone, and a shield 5 grounded is provided for the cathode electrode 3 and the target 3 so as to surround them. The cathode electrode 3 is supplied with radio frequency voltage from a radio frequency power source 6 to form radio frequency plasma of the inert gas in front of the target 2. Ion particles in the plasma collide on the surface of the target 2 thereby to produce sputters of the target material.

A shutter plate 7 is provided to physically interrupt scattering of the sputtering particles from the target 2 to the substrate 11 with a help of a shutter drive mechanism 8. At the time of film deposition the shutter 7 is removed from the front of target 2 so that the substrate 11 directly oppose the target 2.

The substrate holder 9 comprises a holder section 12 and a support section 14 secured to the holder section 12 through an insulating stone 13. The insulating stone 13 is for insulating between the two sections 12 and 14 in order to insulate radio frequency bias voltage the holder section 12 to the support section 14.

The substrate 11 is fixed to the substrate holder 9 at the holder section 12 by fastening means such as machine screws, fasteners or supported by means of fitness or collapse.

The holder section 12 of the substrate holder 9 has radio frequency bias applied thereto, therefore the holder section 12 is mounted on the support section 14 via the insulating stone 13.

The support section 14 has a rail part 141 and the substrate holder 9 is transferred from another vacuum chamber to the film deposition chamber, that is, the vacuum chamber 1 or from the film deposition chamber 1 to the next vacuum chamber by a transfer mechanism. The transfer mechanism comprises rollers 17 connected to a chain, gears etc. of a power transmission 16 which is disposed in the vacuum chamber 1 and a drive motor 15 disposed outside the vacuum chamber 1 and driving the chain or gear.

Radio frequency is applied on the substrate holder 9 at the holder section 12 moving with the support section 14 by a radio frequency source 22 through the substrate electrode 21 for supplying radio frequency bias voltage.

Usually, the substrate electrode 21, which is introduced into the interior of the vacuum chamber 1, is likely to form glow-discharge between the electrode 21 and grounded surrounding members such as a wall of the vacuum chamber 1 under vacuum. In this embodiment, in order to prevent the formation of glow-discharge, an earth shield 18 grounded is provided over a rear side of the holder section 12 of the substrate holder 9. The shield 18 is preferably shaped in a disk-like shape having a central hole and it is spaced a distance from the rear side of the substrate holder 9 at the holder section 12 and contacted with the support section 14 at the outer peripheral portion 181.

If the distance or air gap 28 between the shield 18 and the substrate holder 9 at the holder section 12 is 4 mm or more, the glow-discharge is likely to occur, so that the distance is kept 2 to 4 mm by using a spacer 19 of insulating material such as insulating stone.

The substrate electrode 21 is coaxially surrounded by a coaxial tube 20 with an annular space therebetween for shielding radio frequency and fixed to the coaxial tube 20 by an insulating stone 23 which has a vacuum sealing function.

Figure 3:
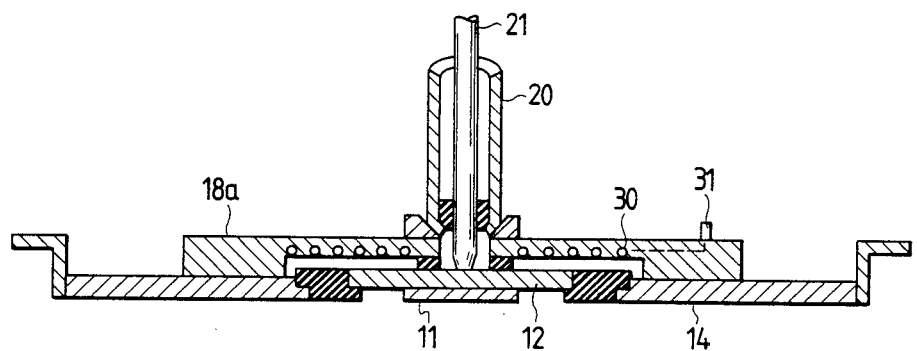
FIG. 3 is a sectional view of another embodiment of a substrate holder employed in the thin film deposition system according to the present invention.

The coaxial tube 20 passes through a hole formed in an upper part of the vacuum chamber 1, and a sealing such as an O-ring 25 or a bellows as shown in FIG. 3 is provided between the coaxial tube 20 and the vacuum chamber 1 at the hole, whereby an engaging part between the coaxial tube 20 and the vacuum chamber 1 is kept in a hermetic condition. The O-ring 25 is held in a groove formed in a retainer 24, so that the O-ring 25 is not removed therefrom. The coaxial tube 20 and the earth shield constitute a shield for shielding radio frequency to prevent the glow-discharge between the wall of the vacuum chamber 1 and the electrode 21 or the holder section 12 of the substrate holder 9.

The substrate 11 transferred from a pre-treatment chamber is stopped at a film deposition position which is a prescribed position over the target 2, and then the axial movement type electrode, that is, the electrode 21 and the coaxial tube 20 are moved axially toward the substrate holder 9 at the holder section by a moving mechanism so that the coaxial tube 20 and the electrode 21 tightly contact with the substrate holder 9 and the earth shield 18. The moving mechanism comprises a pair of hydraulic cylinders 26 and an arm 27 which is secured to the hydraulic cylinders 26 at both the ends and to the coaxial tube 20 at the central portion.

The coaxial tube 20 has a tapered end 201 which is fitted in a conically shaped portion 182 of the earth shield 18 formed at the center. The engagement between the coaxial tube 20 and the earth shield 18 makes contact pressure and contact area larger, which is important for performing its function. The electrode 21 also has a tapered end which is fitted in a conical recess formed in a small projection 121 provided at a central portion of the rear side of the holder section 12 of the substrate holder 9. The construction makes the contact pressure and contacting area larger, which is important to transmit the radio frequency from the electrode 21 to the holder section 12 of the substrate holder 9.

The tapered ends of the coaxial tube 20 and the electrode 21 and the conical shaped portions serve to make an easy engagement therebetween because the conical recess and the conically shaped portion guide the tapered ends when the tapered ends are fitted in the holder section 12 of the substrate holder and the earth shield 18. The construction for engagement between the coaxial tube 20 and the earth shield 18 and between the electrode 21 and the substrate holder 9 at the holder section 12 according to this embodiment make the contact therebetween more excellent than a contact obtained only by pressing the electrode 21 or the coaxial tube 20 on the substrate holder 9 or earth shield 18. The excellent contact reduces electric resistance at the contact portion and enables effective introduction of radio frequency power into the substrate holder with a small dispersion.

Therefore, even if the radio frequency is applied to the substrate holder 9 at the same time as the film is deposited, change in bias voltage and power can be suppressed in small one, whereby more stable bias sputtering can be effected.

The hydraulic cylinder 26 in the moving mechanism for the axial movement type electrode can be replaced by a combination of gears and a motor, with a clutch incorporated therein when necessary.

By adapting the movable introduced electrode with RF shield, as mentioned above, dispersion due to radio frequency transmission can be reduced within about 10%.

Further a preferable embodiment of electric contact of the electrode 21 and the substrate holder 9 is described above, however, the contact can be effected by axially moving only the substrate holder 9, with the coaxial tube 20 and the electrode 21 being fixed. For example it can be done by providing such a moving mechanism that the rail portion 141 of the substrate holder 9 is moved upward and downward by hydraulic cylinders provided to the rail portions 141.

Reference number 29 shows RF shielding means.

Another embodiment is described hereunder in detail referring to FIG. 3.

FIG. 3 shows only an earth shield 18a and its surrounding portions. The other portions are the same as in FIG. 1.

The earth shield 18a has a heater 30 embedded therein and a slide contact terminal 31 exposed out of the earth shield 18a. The slide contact terminal slides while contacting with an electric line provided in the vacuum chamber 1. The substrate 11 is transferred to a film deposition position, an electric power is supplied to the heater 30 thereby generating heat to heat the substrate 11 in process of film deposition, whereby film deposition of high adhesion can be effected.

What is claimed is:

1. A thin film deposition system comprising:
   a vacuum chamber;
   a cathode electrode disposed in said vacuum chamber;
   a target disposed in said vacuum chamber and mounted on said cathode electrode, said target being supplied with radio frequency during sputtering by said cathode electrode;
   a substrate holder, disposed in said vacuum chamber so as to oppose said target with a distance therebetween, for holding a substrate at one side, a front side, of said substrate holder;
   transfer means for moving said substrate holder so as to transfer the substrate held by said substrate holder to or from a film deposition position from or to another position;
   a substrate electrode for applying radio frequency voltage to said substrate through said substrate holder;
   means for effecting relative movement between said substrate electrode and said substrate holder when said substrate is at the film deposition position so that said substrate electrode is intimately contacted with or separated from said substrate holder at an opposite side to the front side;
   shielding means for shielding radio frequency from said substrate electrode and the opposite side of said substrate holder to prevent formation of glow-discharge between said substrate electrode and a surrounding portion and between the opposite side of said substrate holder and a portion surrounding the opposite side of said substrate holder.

2. A thin film deposition system according to claim 1, wherein said means for shielding comprises a coaxial tube surrounding said substrate electrode and fixed to said substrate electrode through an insulating member and an earth shield provided to cover the opposite side of said substrate holder with an air gap.

3. A thin film deposition system according to claim 2, wherein said means for effecting relative movement comprises said coaxial tube and a moving mechanism comprising hydraulic cylinders and an arm, one end of said coaxial tube being fixed to said substrate electrode through the shielding means and the other fixed to said arm connected to said hydraulic cylinders whereby said substrate electrode is moved by said cylinders.

4. A thin film deposition system comprising:
   a vacuum chamber;
   a cathode electrode disposed in said vacuum chamber;
   a target, disposed in said vacuum chamber and mounted on said cathode electrode, for forming plasma during sputtering;
   a substrate holder, having a front side and a rear side and disposed in said vacuum chamber so as to oppose said target with a distance therebetween at the front side, for holding a substrate at the front side;
   a transfer mechanism for transferring said substrate holder;
   a substrate electrode for applying radio frequency voltage to a substrate through said substrate holder;
   an electrode moving mechanism for moving said substrate electrode so as to contact with or separate from the rear side of said substrate holder at a film deposition position, said electrode moving mechanism having a coaxial tube fixed to said substrate electrode through an insulating member and shielding radio frequency from said substrate electrode; and
   an earthed shielding member covering the rear side of said substrate holder holding said substrate with a predetermined distance and being intimately contacted with said coaxial tube when said substrate electrode is in contact with said substrate holder.

5. A thin film deposition system according to claim 4, wherein said electrode moving mechanism comprises a drive section for driving said electrode perpendicularly to the rear side of said substrate holder and said coaxial tube being connected to said drive section at one end of said coaxial tube and fixed to said substrate electrode through said insulating member at the other end.

6. A thin film deposition system according to claim 4, wherein said substrate electrode and said coaxial tube are partially inserted in said vacuum chamber through a hole formed in said vacuum chamber, and a sealing is provided in said vacuum chamber around said hole for sealing between said coaxial tube and said of said vacuum chamber.

7. A thin film deposition system according to claim 6, said sealing is an O-ring mounted on said vacuum chamber so that said coaxial tube is slidably fitted in said O-ring.

8. A thin film deposition system according to claim 6, wherein said sealing is a bellows mounted to said vacuum chamber and said coaxial tube.

9. A thin film deposition system according to claim 4, wherein said coaxial tube has a tapered portion at one end thereof and the tapered portion of said coaxial tube is inserted in a conical recess formed in said earthed shielding member, whereby said coaxial tube is intimately contacted with said earthed shielding member.

10. A thin film deposition system according to claim 4, wherein said substrate holder has a central projection at the center of the rear side of said substrate holder, said central projection having a conical recess formed in its central portion, and receiving a tapered end of said substrate electrode to form intimate contact of said substrate electrode and said substrate holder.

11. A thin film deposition system according to claim 4, wherein said substrate holder is provided with an embedded heater for heating said substrate held by said substrate holder.

12. A thin film deposition system comprising:
a cathode electrode to which radio frequency voltage is applied;
a target disposed in a vacuum chamber and mounted on said cathode electrode for forming plasma during sputtering;
a substrate holder, having a front side and a rear side, and disposed in said vacuum chamber so as to oppose said target with a distance therebetween, said substrate holder holding a substrate at the front side facing said target;
a transfer mechanism for transferring said substrate holder from or to a film deposition position of said vacuum chamber to or from another position;
an axial movement type electrode provided to pass through said vacuum chamber through a hole and comprising an electrode for applying radio frequency voltage to said substrate holder and a coaxial tube surrounding said electrode with an annular space and fixed to said electrode by a insulating member having a sealing function, said axial movement type electrode being moved to contact with or separate from said substrate holder at a film deposition position;
shielding means provided contactably with said coaxial tube for shielding radio frequency from said substrate electrode and the rear side of said substrate holder to prevent formation of glow-discharge between said substrate electrode and a portion surrounding the electrode and between the rear side of said substrate holder and a portion surrounding the rear side of said substrate holder; and
a sealing means provided at said hole of said vacuum chamber for keeping a hermetic condition between said coaxial tube and said vacuum chamber.

13. A thin film deposition system according to claim 12, said shielding means comprises said coaxial tube and an earth shield provided so as to cover said rear side of said substrate holder, wherein said substrate electrode having a tapered end suited to fit in a conical portion formed in a central projection of said substrate holder and said coaxial tube having a tapered end fitted in a conical portion of a central part of said earth shield, whereby said substrate electrode and said coaxial tube are intimately contacted with said substrate holder and said earth shield, respectively.

14. A thin film deposition system for deposition of a thin layer on a substrate through sputtering, said system comprising:
a vacuum chamber having upper and lower sides;
a cathode electrode mounted on the lower side of said vacuum chamber through an insulating member;
a target mounted on said cathode electrode;
a radio frequency power source for supplying radio frequency power to said cathode electrode;
a shield grounded and surrounding said cathode electrode and said target;
a substrate holder disposed in said vacuum chamber to be opposite to said target with a distance therebetween, for holding a substrate so as to face said target, said substrate holder comprising a holder section and a support section secured to said holder section through an insulator;
a transfer mechanism mounted on said vacuum chamber for transferring said substrate holder to or from a layer deposition position from or to another position, said transfer mechanism comprising rollers engaged with said support section of said substrate holder, a driving motor and a transmission for transmitting torque by said motor to said rollers to rotate at a suitable revolutional speed;
an electrode at least a lower part of which is disposed in said vacuum chamber for supplying radio frequency power to said holder section;
a radio frequency power source electrically connected to said electrode for supplying radio frequency power to said electrode;
a coaxial tube passing through a hole formed at the upper side of said vacuum chamber and surrounding said electrode with a spacing and secured to said electrode through an insulating member at the lower part;
a moving mechanism secured to an upper end portion of said coaxial tube for moving said electrode upwards and downwards together with said coaxial tube; and
an earth shield grounded and mounted on said substrate holder so as to cover an opposite side of said holder section of said substrate holder to a substrate held by said substrate holder, with an air gap between said substrate holder and said earth shield, said earth shield having a disk-like shape with a central hole, an inner periphery of said earth shield being secured to said holder section of said substrate holder through an electric insulator and an outer periphery contacted with said support section of said substrate holder, a lower end portion of said coaxial tube being tightly contactable with said central hole of said earth shield, and said electrode being intimately contactable with a central portion of said holder section of said substrate holder; and a sealing provided between said coaxial tube and said vacuum chamber around said hole for preventing air from passing through said hole of said vacuum chamber.

15. A thin film deposition system according to claim 14, wherein said sealing is one selected from a group consisting of O-ring and a bellows.

16. A thin film deposition system according to claim 14, wherein said electrode and said coaxial tube each have a tapered lower end fitted in a conical portion formed in a central portion of each of said substrate holder section and said earth shield.

17. A sputtering system for depositing a thin layer on a substrate, said system comprising:

a cathode electrode disposed in a vacuum chamber including an inert gas;

a target mounted on said cathode electrode for producing plasma;

a substrate holder for holding a substrate to face said target with a predetermined distance;

a transfer mechanism for transferring said substrate holder;

an axial movable electrode disposed so that one end opposes the said substrate holder at an opposite side to a side on which the substrate is mounted;

a moving mechanism for moving axially said axially movable electrode; and a shield grounded and covering said axially movable electrode and said opposite side of said substrate holder, thereby to prevent formation of glow-discharge between said vacuum chamber and said axially movable electrode and between said vacuum chamber and said opposite side of said substrate holder.

* * * * *